United States Patent
Hong et al.

(10) Patent No.: US 7,507,628 B2
(45) Date of Patent: Mar. 24, 2009

(54) METHOD OF MANUFACTURING A NON-VOLATILE MEMORY DEVICE

(75) Inventors: Seung Hee Hong, Seoul (KR); Cheol Mo Jeong, Icheon-si (KR); Eun Soo Kim, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 58 days.

(21) Appl. No.: 11/751,015

(22) Filed: May 19, 2007

(65) Prior Publication Data

US 2008/0099823 A1 May 1, 2008

(30) Foreign Application Priority Data

Oct. 31, 2006 (KR) ...................... 10-2006-0106642

(51) Int. Cl.
*H01L 21/336* (2006.01)
*H01L 29/76* (2006.01)

(52) U.S. Cl. ................. 438/259; 438/270; 438/576; 438/589; 438/E27.091; 257/314; 257/315; 257/316

(58) Field of Classification Search ........... 438/259, 438/270, 576–578, 589–593; 257/314–318
See application file for complete search history.

(56) References Cited

U.S. PATENT DOCUMENTS 7,196,370 B2 * 3/2007 Kai et al. ................... 257/315

FOREIGN PATENT DOCUMENTS

| KR | 1020020096610 A | 12/2002 |
|---|---|---|
| KR | 1020040028384 A | 4/2004 |
| KR | 1020050056661 A | 6/2005 |
| KR | 1020060012695 A | 2/2006 |
| KR | 1020060025262 A | 3/2006 |

* cited by examiner

*Primary Examiner*—Dung A. Le
(74) *Attorney, Agent, or Firm*—Townsend and Townsend and Crew LLP

(57) ABSTRACT

A method of manufacturing a non-volatile memory device includes forming a trench using the shallow trench isolation (STI) method; forming a first insulating layer on a semiconductor device including the trench; forming a conductive layer on the semiconductor device including the trench; etching the conductive layer to form a conductive layer for a floating gate on an active area and to form a recessed gap-fill conductive layer on an isolation layer; forming a second insulating layer and a third insulating layer on the semiconductor substrate including the gap fill conductive layer and the conductive layer for the floating gate; and etching a portion of the second insulating layer and the third insulating layer to form an isolation structure consisting of the gap fill conductive layer, the second insulating layer and the third insulating layer on the isolation area.

8 Claims, 3 Drawing Sheets

METHOD OF MANUFACTURING A NON-VOLATILE MEMORY DEVICE

CROSS-REFERENCES TO RELATED APPLICATIONS

The present application claims priority to Korean patent application number 10-2006-106642, filed on Oct. 31, 2006, which is incorporated by reference in its entirety.

BACKGROUND OF THE INVENTION

The present invention relates to a non-volatile memory device and, more particularly, to a method of manufacturing in which, the conductive layer for a floating gate is used to gap fill a shorted trench (i.e., the trench depth is smaller than in the conventional method), an insulating layer is then formed on the gap fill conductive layer to complete a formation of an isolation structure so that it is possible to prevent voids from being generated in the isolation structure.

In general, the shallow trench isolation (STI) method is used as an isolation forming method for isolating an active area from an isolation area in the non-volatile memory device. As a semiconductor device becomes more integrated, a critical dimension of the active area and a critical dimension of the isolation area (i.e., areas between the active areas for isolating the active areas from each other) are decreased due to a reduction of the design rule. Due to the above configuration, a trench is not completely filled with a high density plasma (HDP) oxide, and voids are generated in the HDP oxide. The above mentioned void may degrade the isolation characteristics of the semiconductor device and generate a cell to cell leakage current, reducing the reliability of the device.

SUMMARY OF THE INVENTION

According to the present invention, in a process of forming the conductive layer for the floating gate, a trench with a shortened depth is filled with a conductive layer (i.e., a shallow gap fill), and a thickness of the conductive layer formed above the trench is reduced to form the floating gates and a shallow trench for the insulating layer. The insulating layer is then formed through a subsequent process (i.e., a shallow gap fill) to form the isolation structure on the conductive layer. Due to the above structure, a generation of voids in the isolation structure is inhibited so that it is possible to prevent current leakage between the cells. Consequently, the reliability of the device can be enhanced.

In order to achieve the above object, the non-volatile memory device according to the present invention comprises a first insulating layer formed on a semiconductor substrate divided into an active area and an isolation area; a floating gate formed on the first insulating layer on the active area; an isolation structure consisting of a gap fill conductive layer formed on the fist insulating layer on the isolation area, a second insulating layer formed on the gap fill conductive layer and a third insulating layer, the gap fill conductive layer being lower than the active area; a dielectric layer formed on the floating gate and the isolation structure; and a control gate formed on the dielectric layer.

In the above non-volatile memory device, the first insulating layer is formed of a silicon oxide ($SiO_2$) layer, and the floating gate is formed of a polysilicon layer. Also, the gap fill conductive layer is formed of a polysilicon layer, and the gap fill conductive layer is formed such that the gap fill conductive layer is lower than the active area of the semiconductor substrate by height of 500 to 700 Å. In addition, the second insulating layer is formed of a silicon oxide ($SiO_2$) layer, and the third insulating layer is formed of a HDP (high density plasma) oxide layer.

Further, in order to achieve the above object, the method of manufacturing a non-volatile memory device according to the present invention comprises the steps of forming a first hard mask layer on a semiconductor substrate; etching some region of the first hard mask layer and the semiconductor substrate using a photoresist layer pattern as an etching mask to form a trench; removing the first hard mask layer; forming a first insulating layer on the semiconductor substrate including the trench; forming a first conductive layer on the semiconductor substrate including the first insulating layer to fill the trench with the conductive layer; forming a second hard mask layer on the first conductive layer; etching some region of the second hard mask layer and the first conductive layer using a photoresist layer pattern as an etching mask to form a conductive layer for a floating gate and a gap-fill conductive layer in the trench, the gap fill conductive layer being lower than the semiconductor substrate; removing the second hard mask layer except a lower nitride layer; forming a second insulating layer on the conductive layer for the floating gate including the gap fill conductive layer and the residual nitride layer; forming a third insulating layer on the semiconductor substrate including the second insulating layer; polishing the third insulating layer until a lower nitride layer of the second hard mask layer is exposed; etching some portion of the third insulating layer and the second insulating layer to form an isolation structure through which a portion of a wall of the conductive layer for the floating gate is exposed; and forming a dielectric layer and a second conductive layer on the conductive layer for the floating gate.

In the above method, the first hard mask layer is formed by stacking sequentially an oxide layer, a nitride layer and an anti-reflection layer, and the first insulating layer is formed of a silicon oxide ($SiO_2$) layer. Also, the first insulating layer is formed of a polysilicon layer. The gap fill conductive layer is formed such that the gap fill conductive layer is lower than the active area of the semiconductor substrate by height of 500 to 700 Å.

In addition, the second hard mask layer is formed by stacking sequentially a nitride layer, an oxide layer, a nitride layer and an anti-reflection layer, the second insulating layer is formed of a silicon oxide ($SiO_2$) layer, and the third insulating layer is formed of a HDP (high density plasma) oxide layer.

DESCRIPTION OF SPECIFIC EMBODIMENTS

An embodiment of the present invention will be described in detail with reference to the accompanying drawings.

Figure 1A:
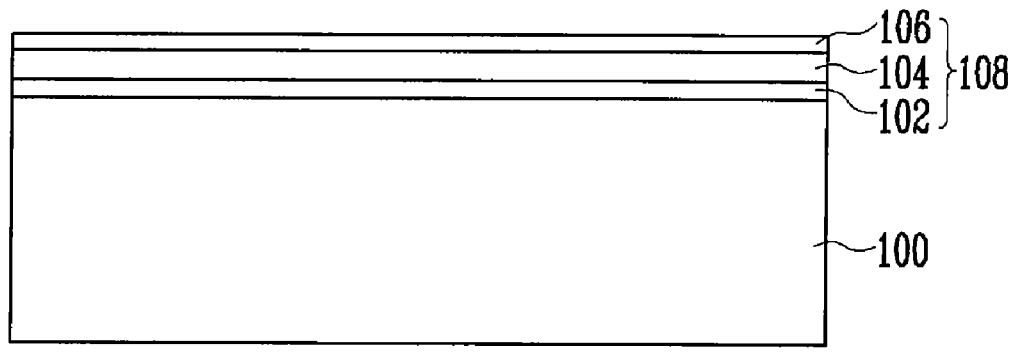
FIG. 1A to FIG. 1I are cross sectional views for illustrating a method for forming an isolation structure in a non-volatile memory device according to an embodiment of the present invention.

Referring to FIG. 1A, a first hard mask layer 108 is formed on a semiconductor substrate 100. The first hard mask layer 108 is made of nitride-based material (hereinafter, referred to as "nitride layer") such as silicon nitride ($Si_xN_y$) or silicon oxide nitride (SiON), or can be formed in a stack structure of a buffer oxide layer and a nitride layer.

The first hard mask layer 108 in this embodiment is formed by stacking sequentially an oxide layer 102, a nitride layer 104 and an anti-reflection layer 106. Here, the oxide layer 102 can be formed of a silicon oxide ($SiO_2$) layer. In a case where the oxide layer is formed of the silicon oxide layer, the oxide layer may be formed through an oxidation process. The nitride layer 104 may be formed of a silicon nitride ($SiN_x$) layer. In a case where the nitride layer is formed of the silicon nitride layer, the nitride layer may be formed through a chemical vapor deposition (CVD) method (e.g., low pressure chemical vapor deposition (LPCVD)). The anti-reflection layer 106 can be formed of a silicon oxide nitride (SiON) layer for preventing a reflection from being generated when a photolithography process using the photoresist layer is performed, and this anti-reflection layer is formed through a chemical vapor deposition (CVD) method.

Figure 1B:
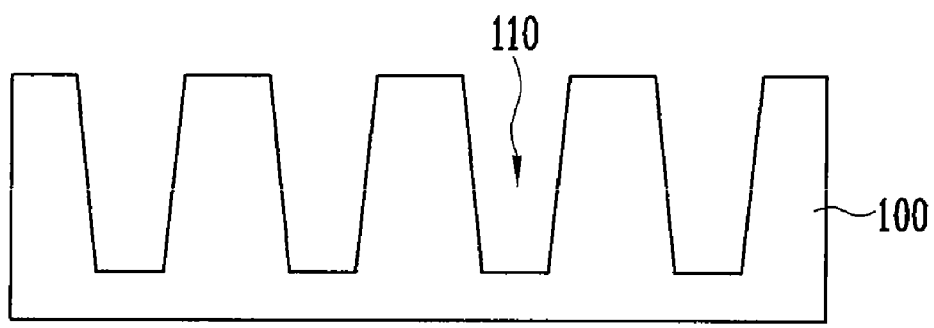

Referring to FIG. 1B, some region of the first hard mask layer 108 is etched using a photoresist layer pattern (not shown) as an etching mask. With this, a STI (shallow trench isolation) trench 110 is formed in an isolation area of the semiconductor substrate 100. The first hard mask layer 108 is then removed.

Figure 1C:
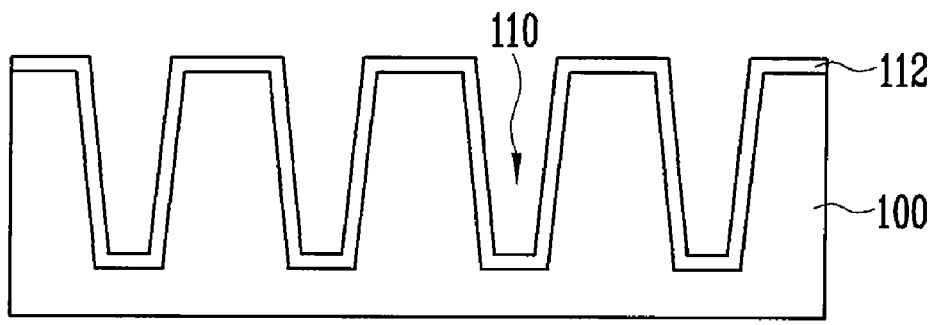

Referring to FIG. 1C, a first insulating layer 112 is formed on the semiconductor substrate 100 including the trench 110. The first insulating layer 112 can be formed of a silicon oxide ($SiO_2$) layer. In a case where the first insulating layer is formed of the silicon oxide layer, the first insulating layer may be formed through the oxidation process.

Here, the first insulating layer 112 formed on an active area performs the function of tunneling the electrons between the semiconductor substrate 110 and a floating gate (not shown, to be formed through a subsequent process) in the program operation or in the erase operation, and so the first insulating layer formed on an active area is called "the tunnel insulting layer". On the other hand, the first insulating layer 112 formed in the trench 110 has a function of isolating the semiconductor substrate 100 from a gap fill conductive layer (not shown, to be formed through a subsequent process), and so the first insulating layer formed in the trench is generally called "the wall insulting layer".

Figure 1D:
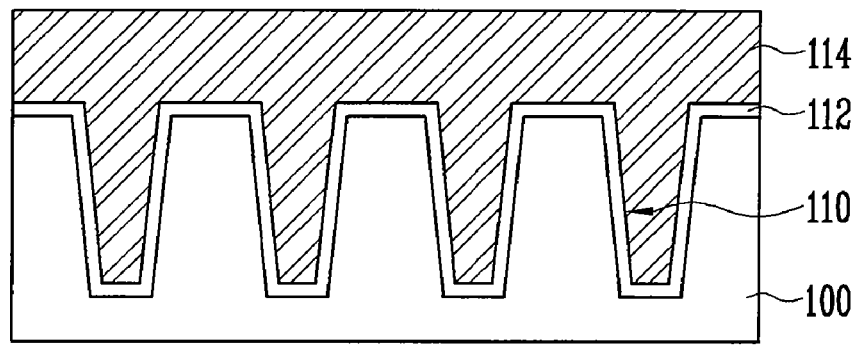

Referring to FIG. 1D, a first conductive layer 114 is formed on the semiconductor substrate 110 including the first insulating layer 112 to fill the trench 110 and form a floating gate. The first conductive layer 114 may be formed of a polysilicon layer, a metal layer or a stack layer consisting of a polysilicon layer and a metal layer.

In order to prevent voids from being generated in the trench 110, the first conductive layer 114 may be formed of a polysilicon layer having an excellent gap filling characteristic and an adhesive force for the lower substrate. A target thickness of the first conductive layer 114 is decided on the basis of a thickness of the floating gate to be formed on the active area. The first conductive layer 114 may be formed through the chemical vapor deposition (CVD) method or the physical vapor deposition (PVD) method. In a case where the first conductive layer is formed of a polysilicon layer, the first conductive layer may be formed by a chemical vapor deposition (CVD) method (e.g., low pressure chemical vapor deposition (LPCVD)).

Figure 1E:
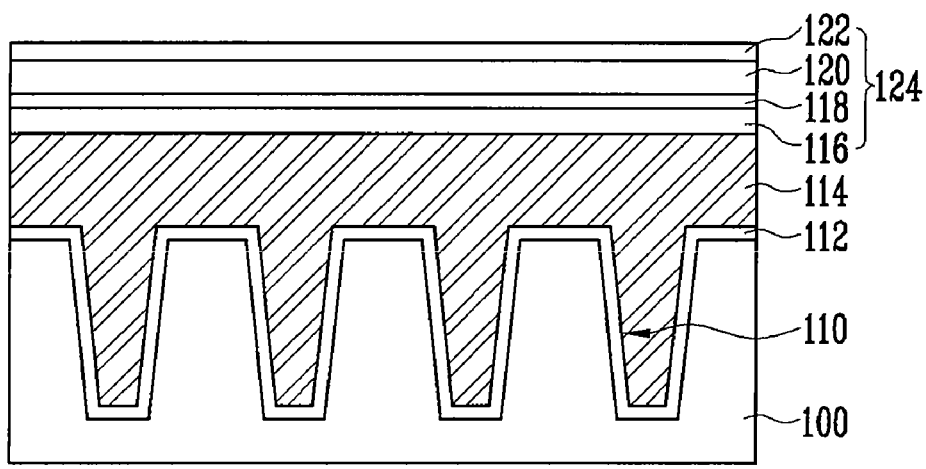

Referring to FIG. 1E, a second hard mask layer 124 is formed on the first conductive layer 114. The second hard mask layer 124 may be formed of a buffer oxide layer, a nitride layer or a stack layer consisting of a buffer oxide layer and a nitride layer. Here, the second hard mask layer 124 is formed of a nitride layer 116, an oxide layer 118, a nitride layer 120 and an anti-reflection layer 122. The nitride layers 116 and 120 are formed of silicon nitride ($Si_xN_y$) layer by means of a chemical vapor deposition (CVD) 20 method. Here, the lower nitride layers 116 of the second hard mask layer 124 acts as the polishing protective layer when a chemical mechanical polishing (CMP) process is performed for polishing an insulating layer which is deposited in the gap fill for forming an isolation structure in a subsequent process. In addition, the oxide layer 118 can be formed of a silicon oxide ($SiO_2$) layer by means of a chemical vapor deposition (CVD) method, the anti-reflection layer 122 is formed for preventing the reflection from being generated during the photolithography process using a photoresist layer, and this anti-reflection layer is formed of a silicon oxide nitride (SiON) layer through a chemical vapor deposition (CVD) method.

Figure 1F:
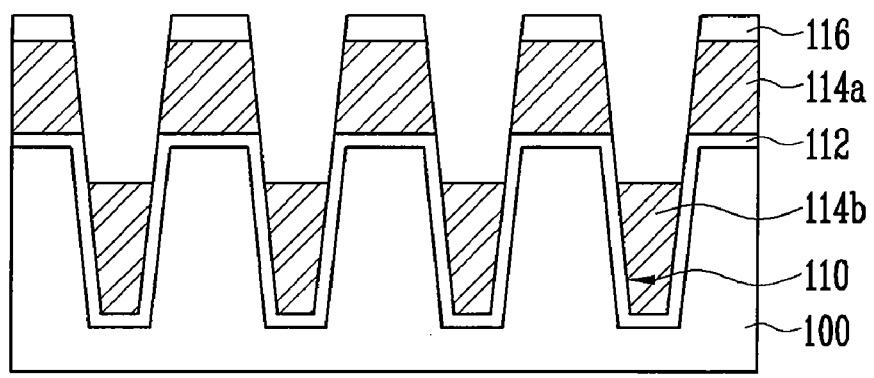

Referring to FIG. 1F, some region of the second hard mask layer 124 and the first conductive layer 114 is etched using a photoresist layer pattern (not shown) as an etching mask. With this, a gap fill conductive layer 114b is formed in the trench 110 of the isolation area.

Here, the gap fill conductive layer 114b is formed such that the gap fill conductive layer is lower than the active area by a height of 500 to 700 Å, and so the active area is isolated from the isolation area.

In the active area, on the other hand, the first conductive layer 114 is etched to form a conductive layer 114a for a floating gate on the tunnel insulating layer 112. Subsequently, the second hard mask layer 124 is removed except the nitride layer 116, this nitride layer 116 being used as the polishing protective layer when a subsequent chemical mechanical polishing (CMP) process for the insulating layer is carried out for forming an isolation structure.

As described above, in a case where the trench 110 is simultaneously filled with the first conductive layer 114 when the first conductive layer 114 is deposited for forming the floating gate (not shown), since the trench 110 is shallow (that is, the trench 110 has a small depth), it is possible to inhibit voids from being generated in the trench 110 if the gap fill conductive layer 114b is formed. Also, by reducing a depth of the gap fill which should be subsequently formed on the gap fill conductive layer 114 through a process for forming the gap fill conductive layer 114b, the insulating layer to be subsequently deposited can be formed without generating void.

Figure 1G:
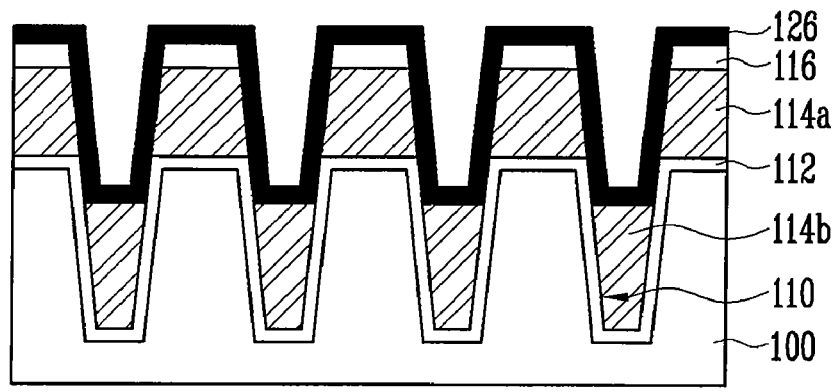

Referring to FIG. 1G, a second insulating layer 126 is formed on the residual nitride layer 116 and the conductive layer 114a for the floating gate including the gap fill conductive layer 114b. The second insulating layer 126 may be formed of a silicon oxide ($SiO_2$) layer, in a case where the second insulating layer is formed of the silicon oxide layer, the second insulating layer may be formed through the oxidation process. The second insulating layer 126 formed as described above is generally called "the wall oxide layer" and minimizes a plasma damage of the high density plasma (HDP) insulating layer for the gap fill during the subsequent process.

Figure 1H:
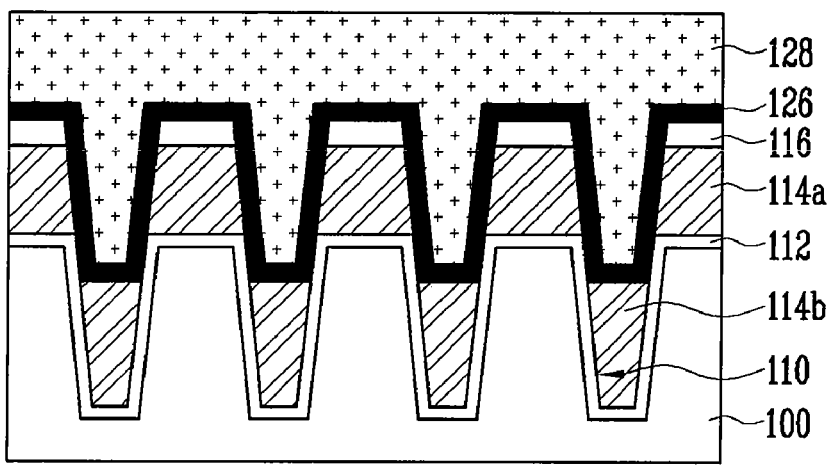

Referring to FIG. 1H, a third insulating layer 128 is formed on the semiconductor substrate 100 including the second insulating layer 126 for filling the gap. The third insulating layer 128 may be formed of a HDP (high density plasma) oxide layer having an excellent gap filling characteristic through the high density plasma (HDP) method.

Figure 1I:
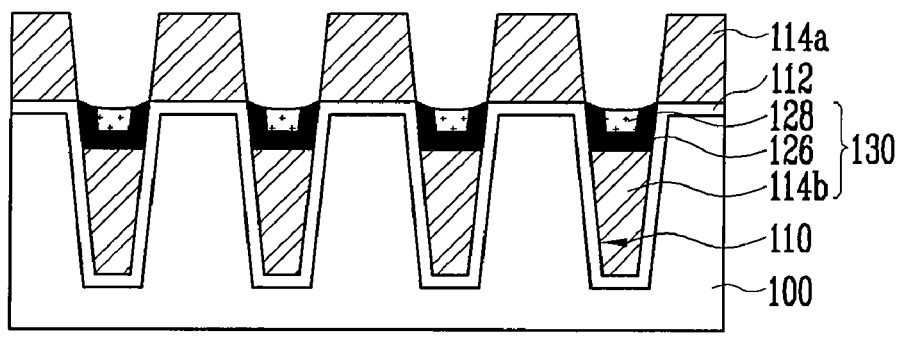

Referring to FIG. 1I, the third insulating layer 128 is polished through a chemical mechanical polishing (CMP) process until the lower nitride layer 116 of the second hard mask layer 124 is exposed. Subsequently, the third insulating layer 128 and the second insulating layer 126 are etched by a certain thickness so as to expose some portion of the wall of the conductive layer 114a for the floating gate. As a result, an isolation structure 130 consisting of the gap fill conductive layer 114b, the second insulating layer 126 and the third insulating layer 128 is formed on the isolation area, and the effective field oxide layer height (EFH) is simultaneously controlled when the isolation structure 130 is formed.

Although not shown in the drawings, a dielectric layer and a second conductive layer are formed on the semiconductor substrate 100 including the conductive layer 114*a* for the floating gate and the isolation structure 130. The dielectric layer is formed of an oxide-nitride-oxide layer. The dielectric layer can be formed through a chemical vapor deposition (CVD) method (e.g., low pressure chemical vapor deposition (LPCVD)). The second conductive layer may be formed of a polysilicon layer, a metal layer or a stack layer consisting of a polysilicon layer and a metal layer through a chemical vapor deposition (CVD) method or a physical vapor deposition (PVD) method.

Subsequently, the second conductive layer, the dielectric layer and the conductive layer 114*a* for the floating gate are sequentially patterned through the conventional process. With this, the floating gate formed of the conductive layer 114*a* for the floating gate and the control gate formed of the second conductive layer are formed.

Although the technical spirit of the present invention has been described in connection with a specific embodiment, the scope of the present invention is not limited by the embodiments but should be construed by the appended claims. Further, it should be understood by those skilled in the art that various changes and modifications can be made thereto without departing from the scope of the present invention.

According to the present invention as described above, in a process of forming the conductive layer for the floating gate, a shortened trench (i.e., a trench depth small enough to prevent voids) is filled with a conductive layer (i.e., a shallow gap fill), and the thickness of the conductive layer above the trench is reduced to form the floating gates and a shallow trench for the insulating layer. Then, in a state where a depth of the gap to be filled is small (i.e., a shallow gap fill), the insulating layer is formed through a subsequent process to complete a formation of the isolation structure. Due to the above structure, a generation of voids in the isolation structure is inhibited so that it is possible to prevent the current leakage from between the cells. Consequently, the reliability of the device can be enhanced.

What is claimed is:

1. A method of manufacturing a non-volatile memory device, the method comprising:

forming a first hard mask layer on a semiconductor substrate;

etching a region of the first hard mask layer and the semiconductor substrate using a photoresist layer pattern as an etching mask to form a trench;

removing the first hard mask layer;

forming a first insulating layer on the semiconductor substrate including the trench;

forming a first conductive layer on the semiconductor substrate including the first insulating layer to fill the trench with the conductive layer;

forming a second hard mask layer on the first conductive layer;

etching a region of the second hard mask layer and the first conductive layer using a photoresist layer pattern as an etching mask to form a conductive layer for a floating gate and a gap-fill conductive layer in the trench, the gap-fill conductive layer having a height that is lower than that of the semiconductor substrate;

removing the second hard mask layer except a lower nitride layer;

forming a second insulating layer on the conductive layer for the floating gate including the gap-fill conductive layer and the residual nitride layer;

forming a third insulating layer on the semiconductor substrate including the second insulating layer;

polishing the third insulating layer until a lower nitride layer of the second hard mask layer is exposed;

etching a portion of the third insulating layer and the second insulating layer to form an isolation structure through which a portion of a wall of the conductive layer for the floating gate is exposed; and forming a dielectric layer and a second conductive layer on the conductive layer for the floating gate.

2. The method of manufacturing the non-volatile memory device as claimed in claim 1, wherein the first hard mask layer is formed by stacking sequentially an oxide layer, a nitride layer and an anti-reflection layer.

3. The method of manufacturing the non-volatile memory device as claimed in claim 1, wherein the first insulating layer is formed of a silicon oxide (SiO2) layer.

4. The method of manufacturing the non-volatile memory device as claimed in claim 1, wherein the first insulating layer is formed of a polysilicon layer.

5. The method of manufacturing the non-volatile memory device as claimed in claim 1, wherein the gap fill conductive layer is formed such that the height of the gap fill conductive layer is lower than the height of the active area of the semiconductor substrate by 500 to 700 Å.

6. The method of manufacturing the non-volatile memory device as claimed in claim 1, wherein the second hard mask layer is formed by stacking sequentially a nitride layer, an oxide layer, a nitride layer and an anti-reflection layer.

7. The method of manufacturing the non-volatile memory device as claimed in claim 1, wherein the second insulating layer is formed of a silicon oxide (SiO2) layer.

8. The method of manufacturing the non-volatile memory device as claimed in claim 1, wherein the third insulating layer is formed of a HDP (high density plasma) oxide layer.

* * * * *